United States Patent
Dasai et al.

(10) Patent No.: US 12,404,580 B2
(45) Date of Patent: Sep. 2, 2025

(54) TUNGSTEN SILICIDE TARGET MEMBER AND METHOD FOR MANUFACTURING SAME, AND METHOD FOR MANUFACTURING TUNGSTEN SILICIDE FILM

(71) Applicant: JX Nippon Mining & Metals Corporation, Tokyo (JP)

(72) Inventors: Takafumi Dasai, Ibaraki (JP); Takayuki Asano, Ibaraki (JP); Takeo Okabe, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 700 days.

(21) Appl. No.: 16/982,125

(22) PCT Filed: Nov. 21, 2018

(86) PCT No.: PCT/JP2018/043048
§ 371 (c)(1),
(2) Date: Sep. 18, 2020

(87) PCT Pub. No.: WO2019/187329
PCT Pub. Date: Oct. 3, 2019

(65) Prior Publication Data
US 2021/0025049 A1 Jan. 28, 2021

(30) Foreign Application Priority Data
Mar. 30, 2018 (JP) .................................. 2018-068855

(51) Int. Cl.
*C23C 14/34* (2006.01)
*B22F 1/05* (2022.01)
(Continued)

(52) U.S. Cl.
CPC ............ *C23C 14/3414* (2013.01); *B22F 1/05* (2022.01); *B22F 3/15* (2013.01); *C01B 33/06* (2013.01);
(Continued)

(58) Field of Classification Search
CPC .............. H01J 37/3426; H01J 37/3429; C23C 14/3414; C23C 14/0682; C01B 33/06;
(Continued)

(56) References Cited

U.S. PATENT DOCUMENTS 5,415,829 A * 5/1995 Ohhashi .................. B22F 9/005
419/33
5,418,071 A * 5/1995 Satou ...................... C04B 35/65
428/548

(Continued)

FOREIGN PATENT DOCUMENTS

JP 6-16412 A 1/1994
JP 6-200367 A 7/1994
(Continued)

OTHER PUBLICATIONS

European communication dated May 10, 2021 in corresponding European patent application No. 18912672.5.
(Continued)

*Primary Examiner* — Michael A Band
(74) *Attorney, Agent, or Firm* — Nields, Lemack & Frame, LLC

(57) ABSTRACT

Provided is a tungsten silicide target that efficiently suppresses generation of particles during sputtering deposition. A tungsten silicide target having a two-phase structure of a $WSi_2$ phase and a Si phase, wherein the tungsten silicide target is represented by a composition formula in an atomic ratio: $WSi_x$ with X>2.0; wherein, when observing a sputtering surface, a ratio of a total area I1 of Si grains having an
(Continued)

area per a Si grain of 63.6 μm² or more to a total area S1 of the Si grains forming the Si phase (I1/S1) is 5% or less; and wherein a Weibull modulus of flexural strength is 2.1 or more.

15 Claims, 6 Drawing Sheets

(51) Int. Cl.
*B22F 3/15* (2006.01)
*C01B 33/06* (2006.01)
*C23C 14/06* (2006.01)
*H01J 37/34* (2006.01)

(52) U.S. Cl.
CPC ...... *C23C 14/0682* (2013.01); *H01J 37/3429* (2013.01); *H01J 37/3491* (2013.01); *B22F 2301/20* (2013.01); *B22F 2302/45* (2013.01); *B22F 2304/10* (2013.01); *C23C 14/34* (2013.01)

(58) Field of Classification Search
CPC .......... B22F 1/05; B22F 3/15; B22F 2301/20; C22C 32/0078
See application file for complete search history.

(56) References Cited

U.S. PATENT DOCUMENTS

| | | | |
|---|---|---|---|
| 5,460,793 A | 10/1995 | Kano et al. | |
| 5,464,520 A | 11/1995 | Kano et al. | |
| 5,919,321 A | 7/1999 | Hirakawa | |
| 6,309,593 B1* | 10/2001 | Sato | C23C 14/3414 419/45 |
| 11,046,616 B2* | 6/2021 | Oda | C04B 35/6261 |
| 2001/0037938 A1 | 11/2001 | Sato et al. | |
| 2019/0389772 A1 | 12/2019 | Kakeno et al. | |
| 2020/0071232 A1 | 3/2020 | Oda et al. | |

FOREIGN PATENT DOCUMENTS

| | | |
|---|---|---|
| JP | 6-322529 A | 11/1994 |
| JP | 8-20863 A | 1/1996 |
| JP | 8-49068 A | 2/1996 |
| JP | 9-228034 A | 9/1997 |
| JP | 2896233 B | 5/1999 |
| JP | 11-200024 A | 7/1999 |
| JP | 2005-239532 A | 9/2005 |
| JP | 5237557 B2 | 7/2013 |
| KR | 10-0264095 B1 | 8/2000 |
| WO | 95/04167 A1 | 2/1995 |
| WO | 99/19102 A1 | 4/1999 |
| WO | 2017/158928 A1 | 9/2017 |
| WO | 2018/173450 A1 | 9/2018 |

OTHER PUBLICATIONS

International Preliminary Report on Patentability issued Oct. 6, 2020 in corresponding PCT application No. PCT/JP2018/043048.
International Search Report and Written Opinion mailed Feb. 5, 2019 in corresponding PCT application No. PCT/JP2018/043048.

* cited by examiner

TUNGSTEN SILICIDE TARGET MEMBER AND METHOD FOR MANUFACTURING SAME, AND METHOD FOR MANUFACTURING TUNGSTEN SILICIDE FILM

FIELD OF THE INVENTION

The present invention relates to a tungsten silicide target, a method for manufacturing the same, and a method for manufacturing a tungsten silicide film.

BACKGROUND OF THE INVENTION

A sputtering method is used in order to form a thin film in a manufacturing step of a semiconductor device. The sputtering method provides improved mass productivity and stability of deposition, and forms a thin film by allowing Ar ions to collide with a target to release metals as target materials and allowing the released metals to deposit onto a substrate opposing to the target.

However, recently, as a degree of integration of LSIs has increased and wiring widths have become finer, generation of particles from a sputtering target has been problematic. The particles may directly deposit to a film on the substrate or deposit to a wall in a chamber or the like, and may be released after the deposition to deposit onto the film again, causing problems such as short circuit and disconnection of wiring. Therefore, various sputtering targets have been proposed in order to decrease the particles from the sputtering target during sputtering.

For example, Patent Literature 1 describes a sputtering target made of tungsten silicide, which has an average surface roughness Ra of a target material of more than 1.0 and 2.0 μm or less.

CITATION LIST

Patent Literatures

[Patent Literature 1] Japanese Patent Application Publication No. H11-200024 A

SUMMARY OF THE INVENTION

An object of the present invention is to provide a tungsten silicide target that efficiently suppresses generation of particles during deposition and a method for manufacturing the same, as well as a method for manufacturing a tungsten silicide film using the tungsten silicide target.

Thus, the tungsten silicide target according to the present embodiment is a tungsten silicide target having a two-phase structure of a $WSi_2$ phase and a Si phase, wherein the tungsten silicide target is represented by a composition formula in an atomic ratio: $WSi_x$ with X>2.0; wherein, when observing a sputtering surface, a ratio of a total area I1 of Si grains having an area per a Si grain of 63.6 μm² or more to a total area S1 of the Si grains forming the Si phase (I1/S1) is 5% or less; and wherein a Weibull modulus of flexural strength is 2.1 or more.

In the tungsten silicide target according to the present embodiment, when observing the sputtering surface, a ratio of a total area I2 of $WSi_2$ grains having an area per a $WSi_2$ grain of 63.6 μm² or more to a total area S2 of the $WSi_2$ grains forming the $WSi_2$ phase (I2/S2) is 5% or less.

In the tungsten silicide target according to the present embodiment, when observing the sputtering surface, the ratio of the total area I2 of the $WSi_2$ grains having the area per a $WSi_2$ grain of 63.6 μm² or more to the total area S2 of the $WSi_2$ grains forming the $WSi_2$ phase (I2/S2) is 0.1% or less.

In the tungsten silicide target according to this embodiment, when observing the sputtering surface, an average area per a $WSi_2$ grain is 6.0 μm² or less.

In the tungsten silicide target according to this embodiment, when observing the sputtering surface, the average area per a $WSi_2$ grain is 3.0 μm² or less.

In the tungsten silicide target according to the present embodiment, when observing the sputtering surface, an average area per a Si grain is less than 2.5 μm².

In the tungsten silicide target according to the present embodiment, the average area per a Si grain is 1.2 μm² or more.

In the tungsten silicide target according to the present embodiment, the average flexural strength is 250 MPa or more.

The tungsten silicide target according to the present embodiment has an oxygen concentration of 700 ppm by mass or more.

The tungsten silicide target according to the present embodiment has a relative density of 99.9% or more.

Further, the method for manufacturing the tungsten silicide target according to the present embodiment is a method for manufacturing the above tungsten silicide target, the method comprising: a preparing step comprising mixing W powder with Si powder such that an atomic ratio Si/W is larger than 2.0, and causing a siliciding synthesis to prepare mixed powder in which $WSi_2$ phases and Si phases are combined to form individual grains; a pulverizing step of pulverizing the mixed powder; and a sintering step of subjecting the pulverized mixed powder to hot-pressing sintering to provide a sintered body.

In the method for manufacturing the tungsten silicide target according to the present embodiment, the W powder has a BET value of 1.0 m²/g or less.

In the method for manufacturing the tungsten silicide target according to the present embodiment, the Si powder has a BET value of 2.5 m²/g or less.

In the method for manufacturing the tungsten silicide target according to the present embodiment, the pulverizing step comprises pulverizing the mixed powder such that the BET value of the pulverized grains is 1.0 m²/g or less.

Further, a method for manufacturing a tungsten silicide film according to an embodiment of the present invention comprises a deposition step of carrying out sputtering using the above tungsten silicide target.

According to the tungsten silicide target of the present embodiment, it is possible to provide a tungsten silicide target that efficiently suppresses generation of particles during deposition

DETAILED DESCRIPTION OF THE INVENTION

Figure 1:
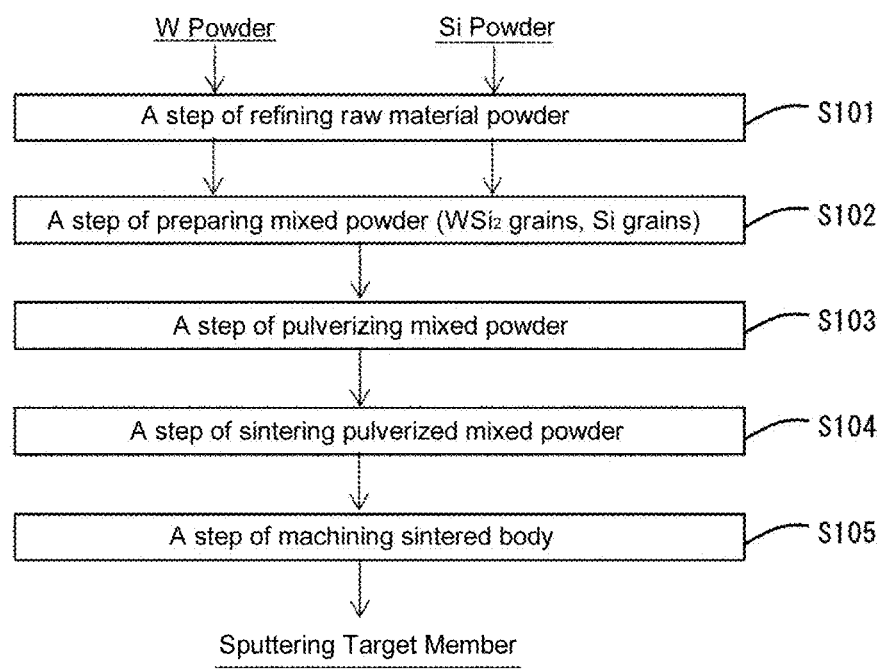
FIG. 1 is a flowchart showing an outline of a method for manufacturing a tungsten silicide target according to an embodiment of the present invention.

Hereinafter, the present invention is not limited to each embodiment, and elements can be modified and embodied without departing from the spirit of the invention. Further, various inventions can be formed by appropriately combining a plurality of elements disclosed in each embodiment. For example, some elements may be deleted from all elements shown in embodiments. Furthermore, elements of different embodiments may be combined as needed. As used herein, a BET value refers to a value measured by a gas adsorption method (a BET method) according to JIS Z 8830: 2013 (ISO 9277: 2010). The BET value is the total surface area per unit weight (1 g) of powder to be measured and is expressed in a unit of square meter, and is also referred to as a specific surface area (m$^2$/g). Therefore, finer powder results in a higher surface area, thereby providing a higher BET value.

As a result of intensive studies, the present inventors have found that a decreased proportion of Si grains having an area higher than a predetermined value and a Weibull modulus of flexural strength having an intended value or more lead to a tungsten silicide target that is densified and has uniformly dispersed grains without being coarsened, whereby the tungsten silicide target that can efficiently suppress particles during deposition can be obtained.

The tungsten silicide target according to this embodiment will be described below.

[1. Tungsten Silicide Target]

According to the tungsten silicide target of the present embodiment, it is possible to efficiently suppress the generation of particles during deposition. The tungsten silicide target according to the embodiment has a two-phase structure of a WSi$_2$ phase and a Si phase, and has a composition formula in atomic ratio represented by WSi$_x$ with X>2.0.

(Si Phase)

The tungsten silicide target according to an embodiment of the present invention contains WSi$_2$ grains forming the WSi$_2$ phases and Si grains forming the Si phases. For a decrease in the particles, areas of the Si grains are more related with the generation of the particles than areas of the WSi$_2$ grains. This will lead to irregularities (in an erosion direction) on a sputtering surface due to preferential sputtering of the Si grains because the Si grains on the sputtering surface are more easily sputtered than the WSi$_2$ grains. As the irregularities becomes larger, abnormal discharge is easily generated during sputtering, so that the number of particles increases. Therefore, the tungsten silicide target is required to have a smaller Si grain area. Therefore, in the tungsten silicide target according to the present embodiment, when observing the sputtering surface, a ratio of a total area I1 of Si grains having an area per a Si grain of 63.6 μm$^2$ or more to a total area S1 of the Si grains forming the Si phase (I1/S1) is 5% or less, and preferably 2.5% or less, and more preferably 0.5% or less. This can allow the irregularities on the sputtering surface caused by preferential sputtering of the Si grains to be decreased, so that the generation of the particles during sputtering can be efficiently suppressed. Here, in the tungsten silicide target according to the present embodiment, a texture image is observed on the sputtering surface of the tungsten silicide target using SEM. The areas of the Si grains are calculated by obtaining an SEM image of the sputtering surface of the tungsten silicide target and then analyzing the image with analysis software.

In the tungsten silicide target according to the present embodiment, due to a difference between deposition rates of Si and WSi$_2$, when observing the sputtering surface, an average area per a Si grain is less than 5.0 μm$^2$, and preferably less than 3.2 μm$^2$, and even more preferably less than 2.5 μm$^2$, and still more preferably less than 2.0 μm$^2$, in terms of suppressing the generation of the particles during sputtering. However, from the viewpoint of manufacturing efficiency, when observing the sputtering surface, the average area per a Si grain is preferably 1.2 μm$^2$ or more, and more preferably 1.5 μm$^2$ or more, and still more preferably 1.8 μm$^2$ or more. Here, the average area per a Si grain is calculated by obtaining a SEM image of a sputtering surface of the tungsten silicide target and then analyzing the image with analysis software.

(WSi$_2$ Phase)

The WSi$_2$ grains forming the WSi$_2$ phases have different sputtering rates which are indices for forming a film, depending on crystal orientations. If the WSi$_2$ grains are larger, erosion progresses only at a specific portion due to a difference of crystal orientations to increase the irregularities (in the erosion direction) on the sputtering surface, so that the particles are generated. For this reason, the areas of WSi$_2$ grains are required to be decreased, as with the areas of the Si grains. Therefore, in the tungsten silicide target according to an embodiment of the present invention, when observing the sputtering surface, a ratio of a total area I2 of WSi$_2$ grains having an area per a WSi$_2$ grain of 63.6 μm$^2$ or more to a total area S2 of the WSi$_2$ grains forming the WSi$_2$ phase (I2/S2) is 5% or less, and preferably 2.5% or less, and more preferably 0.5% or less, and still more preferably 0.1% or less. This can lead to finer WSi$_2$ phases of the tungsten silicide target, so that a difference between progressing speeds of sputtering is decreased, and the particles can be more efficiently suppressed during sputtering. Here, in the tungsten silicide target according to the present embodiment, a crystal orientation is defined for the sputtering surface of the tungsten silicide target by electron beam backscattering diffraction (EBSD). As the electron beam is incident on a sample, the electron beam causes scattering elasticity on a surface of the sample, and diffraction occurs according to the Bragg's diffraction condition. At this time, the Kikuchi line is generated. By analyzing the Kikuchi line, information such as an orientation distribution of a measurement area and a crystal phase can be obtained for each crystal grain. Therefore, since the WSi$_2$ phase and the Si phase having different Kikuchi line patterns are easily separated for each of the phases, the WSi$_2$ phase can be observed. For example, the area per a WSi$_2$ grain is calculated by specifying a grain size of the WSi$_2$ phase by identifying a boundary having a plane orientation difference of 15° or more as a crystal grain boundary utilizing the fact that the WSi$_2$ grains have random orientations. In addition, an average equivalent circle diameter in the area of 63.6 μm$^2$ per a WSi$_2$ grain is 9 μm.

In the tungsten silicide target according to an embodiment of the present invention, when observing the sputtering surface, an average area per a WSi$_2$ grain is preferably 6.0 μm$^2$ or less, and more preferably 4.8 μm$^2$ or less, and still more preferably 3.7 μm$^2$ or less, in terms of suppressing the generation of the particles during sputtering. However, from the viewpoint of manufacturing efficiency, when observing the sputtered surface, the average area per a $WSi_2$ grain is preferably 3.0 μm² or more, and more preferably 3.2 μm² or more, and even more preferably 3.3 μm² or more. Here, the average area per a $WSi_2$ grain is calculated on the sputtering surface of the tungsten silicide target by EBSD in the same manner as described above.

(Average Flexural Strength)

In the tungsten silicide target according to an embodiment of the present invention, an average flexural strength is preferably 250 MPa or more, and more preferably 280 MPa or more, and even more preferably 350 MPa or more, in order to prevent cracking, chipping, or the like during sputtering and to suppress the generation of the particles. The average flexural strength is an average value of flexural strengths measured at five or more points on the sputtering target using a tensile compression tester in accordance with "JIS R 1601: 2008 Testing method for flexural strength (modulus of rupture) of fine ceramics at room temperature".

(Weibull Modulus)

Further, in the tungsten silicide target according to an embodiment of the present invention, a Weibull Modulus of the flexural strength is 2.1 or more, and preferably 2.3 or more, and even more preferably 2.7 or more, in terms of increasing the uniformity of the tungsten silicide target and eliminating internal defects. Here, the Weibull Modulus indicates an amount of fine pores which do not show as a difference in the relative density and have very slight ratio of a volume to the total volume. The slight pores cause stress concentration points, leading to easy breakage of a material starting from the pores. Therefore, a lower Weibull Modulus means that there are many fine pores, and a higher Weibull Modulus means that there are less fine pores. The higher the amount of fine pores present in the material, the higher the amount of the particles generated during sputtering. That is, the higher Weibull Modulus results in tendency to decrease the number of the particles. For example, in density measurement according to the Archimedes method, a density error of ±milligram order is present due to factors or the like which affect the density of water such as an atmospheric pressure and a temperature. Therefore, in the case of about 7.903 g/cm³ which is the theoretical density of the tungsten silicide target material (composition formula: $WSi_x$ with x=2.7), it is difficult to discuss the amount of pores in the sintered body having a relative density of 99.9% or more. Further, in the case of the relative density of the sintered body of 99.9% or more, the pores in the sintered body are considerably small due to the higher relative density, so that it is difficult to discuss the number of pores in the sintered body. Therefore, the characteristics of the tungsten silicide target according to the present embodiment are represented by the Weibull Modulus of the flexural strength.

It should be noted that the Weibull Modulus is measured in accordance with "JIS R 1625: 2010 Weibull statistical analysis of strength data for fine ceramics".

Since the tungsten silicide target according to the present embodiment does not require any extreme decrease in an oxygen concentration, the generation of the semi-sintered low oxygen portion, which is a side effect of the decreased oxygen concentration, is significantly suppressed. The oxygen concentration in the tungsten silicide target is always 700 ppm by mass or more, which is generally an unavoidable oxygen concentration when finely pulverized by a pulverizing method such as a jet mill to obtain fine raw material powder. The oxygen concentration can be utilized as an index indicating that sufficient refinement has been achieved. From this viewpoint, the oxygen concentration is preferably 700 ppm by mass or more, and more preferably 1000 ppm by mass or more, which is considered to be capable of achieving further refinement. Further, the oxygen concentration in the tungsten silicide target is preferably 5000 ppm by mass or less, and more preferably 3000 ppm by mass or less, and even more preferably 2500 ppm by mass or less, in terms of preventing excessive generation of an oxide which is originally a cause of micro-arcing and is considered to generate the particles. It is noted that in the present specification, the oxygen concentration in the tungsten silicide target is measured by an inert gas melting-infrared absorption method.

If the fine grains by the pulverization are maintained until the end of the sintering of the tungsten silicide target and the semi-sintered low oxygen portion is sufficiently suppressed, the generation of the particles during sputtering can be significantly suppressed even if the oxygen concentration in the tungsten silicide target is high. The semi-sintered low oxygen portion refers to sponge-shaped tungsten silicide that remains after the silicon that has existed inside the sintered region disappears due to volatilization as silicon monoxide with adsorbed oxygen.

Generally, in a tungsten silicide material synthesized with excess silicon introduced, its components are mainly two types of grains: tungsten disilicide produced by binding one atom of tungsten to two atoms of silicon, and silicon that is excess and remains without reacting with tungsten. For expression of these densities, the Archimedes method or the like can be used to determine the densities relatively easily. However, what is important for suppression of the particles is how a dense material structure can be obtained, and generally used is relative density to theoretical density. Therefore, the tungsten silicide target according to the present embodiment has substantially no void in the sintered body, and thus preferably has a relative density of 99.9% or more.

Hereinafter, a method for calculating the relative density of the tungsten silicide target will be described.

After measuring the weight of the tungsten silicide target, the tungsten silicide target is placed in a container containing 1 L of water, and a volume of the tungsten silicide target is determined by the Archimedes method. The measured density of the tungsten silicide target is then calculated. On the other hand, the theoretical density of the tungsten silicide target (composition formula: $WSi_x$ with X=2.7) is 7.903 g/cm³. When the measured density of the obtained tungsten silicide target is 7.899 g/cm³, it will be 7.899/7.903=99.9%. The obtained numerical value means that there is substantially no void inside the sintered body.

In the tungsten silicide target according to the present embodiment, the total concentration of impurities other than oxygen is 0.1% by mass or less, and preferably 0.01% by mass, and more preferably 0.001% by mass or less, so as not to be incorporated as impurities in the formed tungsten silicide layer. Tungsten and silicon having a purity of 5 to 9 N are easily available from the market as raw materials, and the use of such a high-purity raw material can easily achieve the total concentration of impurities other than oxide in the tungsten silicide target produced of 0.001% by mass or less. Here, in this specification, the concentration of impurities other than oxygen is measured by the GDMS method, and the elements to be measured are Fe, Al, Ni, Cu, Cr, Co, K, Na, U, and Th.

The tungsten silicide target according to the present embodiment can be used by processing it into any shape, including, but not limited to, a disk shape, a rectangular plate shape, a cylindrical shape, and the like.

The tungsten silicide target according to the present embodiment may be joined to a backing plate. The target and the backing plate may be joined by any known method, for example, using a low melting point solder such as indium solder, tin solder, and tin alloy solder. Any known material may be used as a material of the backing plate, including, for example, copper (for example, oxygen-free copper), copper alloys, aluminum alloys, titanium, stainless steel, and the like.

The tungsten silicide target according to this embodiment can be used as, but not limited to, a tungsten silicide target for forming electrodes, wirings, and contact barriers of semiconductor devices such as LSIs. There is no particular limitation on a sputtering device that can be used by the tungsten silicide target according to the present embodiment. For example, a magnetron sputtering device, an RF application type magnetron DC sputtering device or the like can be used.

[2. Method for Manufacturing Tungsten Silicide Target]

Next, a method for manufacturing the tungsten silicide target according to an embodiment of the present invention will be described with reference to the drawings. FIG. 1 is a flowchart showing an outline of a method for manufacturing a tungsten silicide target according to an embodiment of the present invention. As shown in FIG. 1, the method for manufacturing the tungsten silicide target according to the present embodiment includes a step S101 of refining raw material powder (W powder and Si powder) (hereinafter, referred to as a "refining step"); a step S102 of preparing mixed powder of $WSi_2$ grains and Si grains (hereinafter, referred to as a "preparing step"); a step S103 of pulverizing the mixed powder (hereinafter, referred to as a "pulverizing step"); a step S104 of sintering the pulverized mixed powder (hereinafter, referred to as a "sintering step"); and a step S105 of machining the sintered body (hereinafter, referred to as a "machining step"). Each of the steps S101 to S105 will be described below.

(Refining Step)

In the refining step S101, both of the W powder and the Si powder, which are the raw material powders, are placed in a pulverizing device and pulverized, or the W powder and the Si powder are separately placed in a pulverizing device and pulverized. The sizes of the W powder and the Si powder are reflected in the sizes of the $WSi_2$ grains and the Si grains in the tungsten silicide target, which affects the refinement of the structure. Therefore, when manufacturing the tungsten silicide target, the W powder and the Si powder are previously made finer in order to control the sizes of the $WSi_2$ powder and the Si powder which can make up the material.

The W powder and the Si powder are preferably pulverized by a pulverizing device so as to have the following BET value. For example, the BET value of the W powder is preferably 1.0 $m^2/g$ or less, and more preferably 0.9 $m^2/g$ or less, and even more preferably 0.7 $m^2/g$ or less, and still more preferably 0.4 $m^2/g$ or less. Further, for example, the BET value of the Si powder is preferably 2.5 $m^2/g$ or less, and more preferably 2.2 $m^2/g$ or less, and even more preferably 2.0 $m^2/g$ or less, and still more preferably 1.9 $m^2/g$ or less. However, typically, each BET value of the W powder and the Si powder is preferably 0.1 $m^2/g$ or more. In this case, it is possible to use the W powder and the Si powder which, for example, have a purity of 99.9% by mass or more, and preferably 99.99% by mass or more, and more preferably 99.999% by mass or more. For the W powder and the Si powder, those having the BET value in the suitable range are currently commercially available. Therefore, the commercially available products may be used.

The pulverizing device is not particularly limited as long as the W powder and the Si powder can be pulverized, examples being a ball mill, a multi-stirring blade rotary type medium stirring mill, a jet mill, and a planetary ball mill. The pulverization is preferably carried out in an atmosphere of an inert gas such as nitrogen or argon to suppress unnecessary oxidation. After pulverizing the W powder and the Si powder, non-standard coarse grains may be removed by sieving them with a sieve having an intended opening or by a gas phase classifier.

(Preparing Step)

In the preparing step S102, mixed powder in which the $WSi_2$ phases and the Si phases are combined to form individual grains is prepared, including mixing the W powder with the Si powder such that an atomic ratio of Si/W is, for example, higher than 2.0, and carrying out a silicide synthesis under intended conditions (synthesis temperature, synthesis time, vacuum pressure).

The synthesis temperature is, for example, preferably from 1200 to 1400° C., and more preferably from 1250 to 1350° C., and still more preferably from 1270 to 1320° C. The synthesis time is, for example, from 1 to 6 hours, and preferably from 2 to 5 hours, and more preferably from 3 to 4 hours. The vacuum pressure is, for example, preferably 1.0 Pa or less, and more preferably $1.0 \times 10^{-2}$ Pa or less, and still more preferably $1.0 \times 10^{-4}$ Pa or less.

A predetermined amount of the refined W powder and Si powder are weighed and mixed in a container, and a silicidation synthesis is then caused in a synthesis furnace. The silicidation synthesis provides mixed powder in which the $WSi_2$ phases and the Si phases are combined to form individual grains. The $WSi_2$ phase has a stoichiometric ratio of W and Si of W:Si=1:2. Therefore, excess Si grains remain in the container. The synthesis proceeds until the pure W phases disappear, resulting in the mixed powder in which only the $WSi_2$ phases and the Si phases remain.

(Pulverizing Step)

In the pulverizing step S103, the mixed powder is pulverized by the pulverizing device to obtain pulverized mixed powder. The sizes of grains in the mixed powder is reflected in the sizes of the $WSi_2$ grains and the Si grains in the target, which affects the refinement of the structure. Therefore, the mixed powder is pulverized such that a BET value of the pulverized grains is preferably 1.0 $m^2/g$ or less, and more preferably 0.8 $m^2/g$ or less, and even more preferably 0.6 $m^2/g$ or less, for example, it can be from 0.1 to 1.0 $m^2/g$. The grains of the mixed powder are obtained by pulverizing those in which the Si phases and the $WSi_2$ phases are combined to form individual grains. Therefore, the generation of secondary grains due to aggregation of the raw material powder is suppressed, resulting good dispersion form of the Si phases and the $WSi_2$ phases in the final target.

The pulverizing device is not particularly limited as long as it can pulverize the mixed powder, examples being a ball mill, a multi-stirring blade rotary type medium stirring mill, a jet mill, and a planetary ball mill. The pulverization is preferably carried out in an atmosphere of an inert gas such as nitrogen or argon to suppress unnecessary oxidation. In addition, after pulverizing the mixed powder, non-standard coarse grains may be removed by sieving them with a sieve having an intended opening or by a gas phase classifier.

It is preferable that an oxygen concentration of the pulverized grains is adjusted to 500 ppm by mass to 3000 ppm by mass, and preferably 700 ppm by mass to 2700 ppm by mass, and more preferably 1500 ppm by mass to 2500 ppm by mass, prior to sintering, because it is easy to control the oxygen concentration in the target obtained after the sintering to a target range. Therefore, when the oxygen concentration of the mixed powder before pulverization is too high or the like, the pulverizing step S103 of pulverizing the mixed powder may be carried out after deoxygenation by heating the $WSi_2$ powder and the Si powder in a separate manner or in a mixed state under vacuum.

Also, the mixed powder obtained by synthesizing tungsten silicide to form individual grains can be pulverized to obtain the $WSi_2$ powder, which is then mixed with the Si powder to obtain the pulverized mixed powder of the $WSi_2$ powder and the Si powder. When mixing different powders such as the $WSi_2$ powder and the Si powder, a V-type mixer, a pot mill, a ball mill, a planetary ball mill or the like may be preferably used.

(Sintering Step)

After obtaining the pulverized mixed powder having the predetermined oxygen concentration and BET value, the mixed powder is subjected to hot-pressing sintering to obtain a sintered body. The hot pressing is preferably carried out under conditions where the density and strength of the sintered body can be increased. The hot pressing can be carried out, for example, under the following conditions:

Pressing Temperature: 1250 to 1400° C., preferably 1300 to 1390° C.;
Atmosphere (degree of vacuum): $1\times10^{-1}$ Pa to $1\times10^{-2}$ Pa;
Pressing Pressure: 15 to 50 MPa, preferably 25 to 50 MPa;
Pressing Time: 60 to 180 minutes after reaching the maximum temperature, preferably 120 to 180 minutes after reaching the maximum temperature; and
Retention Time: 120 to 240 minutes, preferably 120 to 180 minutes.
The retention time refers to a time to maintain the pressing temperature after reaching the predetermined pressing temperature.

(Machining Step)

After hot pressing, the press product is machined into an intended shape to provide a tungsten silicide target.

[3. Method for Manufacturing Tungsten Silicide Film]

A method for manufacturing a tungsten silicide film according to an embodiment according to the present invention includes: a deposition step of carrying out sputtering with a sputtering device using the above tungsten silicide target according to the embodiment. The tungsten silicide film is used as an LSI electrode and wiring. A thickness of the tungsten silicide film may be optionally changed depending on applications to be used.

EXAMPLES

The present invention will be specifically described based on Examples and Comparative Examples. The following descriptions of Examples and Comparative Examples are merely specific examples for facilitating understanding of the technical content of the present invention, and the technical scope of the present invention is not limited by these specific examples. In the following descriptions, all oxygen concentrations were measured by an oxygen analyzer (TC 600, from LECO) using an inert gas melting-infrared absorption method. Further, the BET value was calculated from an adsorption isotherm by the BET method. The adsorption isotherm was obtained with a specific surface area measuring device (Macsorb® HM model-1201, from Mountech Co., Ltd.), using a He—$N_2$ gas and liquid nitrogen at −196° C. as a refrigerant, under a pretreatment conditions of heating at 200° C. for 0.5 hour, and under a measured relative pressure of 0.05<P/Po<0.3. The median diameter D50 is indicated by a grain diameter at the time when the cumulative volume is 50%.

Example 1

First, as commercially available W raw material powder, W powder having a BET value of from 0.75 to 0.85 $m^2/g$ and a purity of 5N was prepared. As commercially available Si raw material powder, Si powder having a BET value of from 1.8 to 2.0 $m^2/g$ was prepared.

The W powder and the Si powder were then mixed together at an atomic ratio of W:Si=1:2.7 in a mill, and tungsten silicide ($WSi_x$) was synthesized in a synthesis furnace. For the synthesis conditions, the tungsten silicide was subjected to evacuation up to $5\times10^{-4}$ Torr, and synthesis was then carried out at 1250 to 1390° C. for 1 to 5 hours. At the end of the synthesis, the interior of the furnace was allowed to cool, and the resulting product was removed from the furnace at the time when the temperature was decreased to 50° C., to obtain mixed powder in which the $WSi_2$ phases and the Si phases were combined to form individual grains. The resulting mixed powder was processed by a jet mill in an inert gas atmosphere, and classified such that the pulverized grains had a median diameter D50 of 4.9 μm or less. As a result, as shown in Table 1, the characteristics of the pulverized grains were obtained. The median diameter D50 of the pulverized grains was calculated by ultrasonic dispersion measurement in ultrapure water using a laser diffraction/scattering particle size distribution analyzer (HORIBA, Partica mini LA-350).

The resulting pulverized mixed powder was introduced into a carbon die and hot-pressed. The hot pressing conditions were as follows:

<Hot Pressing Conditions>
Pressing Temperature: 1370° C.;
Atmosphere: vacuum of $1\times10^{-1}$ to $1\times10^{-2}$ Pa;
Pressing Pressure: 29.4 MPa;
Pressing Time: 60 to 180 minutes after reaching the maximum temperature; and
Retention Time: 140 minutes.
The retention time refers to a time to maintain the pressing temperature after reaching the predetermined pressing temperature.

After hot pressing, the pressed product was taken out and machined into a disk-shaped tungsten silicide target having a diameter of 164 mm and a thickness of 5 mm. An area of the sputtering surface of the target is 211 $cm^2$. An oxygen concentration of the resulting tungsten silicide target is shown in Table 2.

(Relative Density)

First, an actual density pr of the resulting tungsten silicide target was calculated according to Archimedes' method. Subsequently, assuming a two-phase state of the Si phase and the $WSi_2$ phase from the composition of W/Si, a theoretical density pt calculated from the density and abundance ratio of the Si phases and the $WSi_2$ phases was calculated. A relative density (pr/pt) of the actual density pr of the tungsten silicide target to the theoretical density pt of the tungsten silicide target was then calculated.

(Average Flexural Strength, Weibull Modulus)

Figure 2:
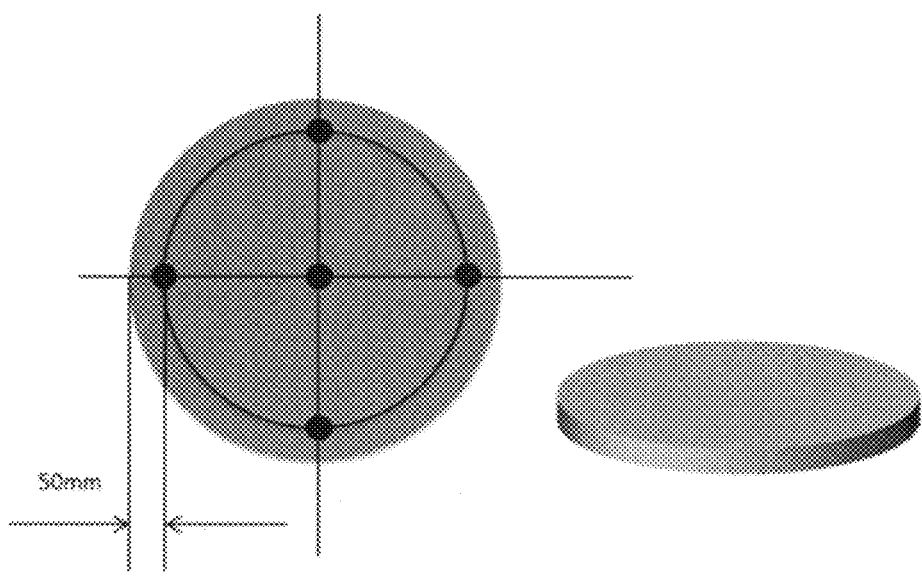
FIG. 2 is a schematic view showing measurement points for an average flexural strength of a tungsten silicide target obtained in Example 1.

An average flexural strength was determined by measuring the flexural strengths of the disk-shaped tungsten silicide target having a diameter of 460 mm and a thickness of 10 mm at five points as shown in FIG. 2 using a tensile compression tester (SV-201NA-50SL, from IMADA-SS Corporation) and calculating its average value. The Weibull Modulus was measured in accordance with the Japanese Industrial Standard defined as "JIS R 1625: 2010 Weibull statistics of strength data for fine ceramics". First, for a total of 5 points where the flexural strength was measured, plots were taken along the X axis and the Y axis in line with the following equations 1 to 3 to draw a straight line by the least squares method. The Weibull Modulus was then calculated from the slope of the straight line.

$$X = \log \sigma_{max} \quad \text{(Equation 1)}$$

$$Y = ln(ln(1/(1-F(t)))) \quad \text{(Equation 2)}$$

$$F(t) = (t-0.3/(N+0.4)) \quad \text{(Formula 3)}$$

$\sigma_{max}$: maximum flexural strength
ln: natural logarithm
t: rank indicating rank order of strengths
N: number of samples.

(Area Ratio and Average Area of Si Grains)

Figure 3:
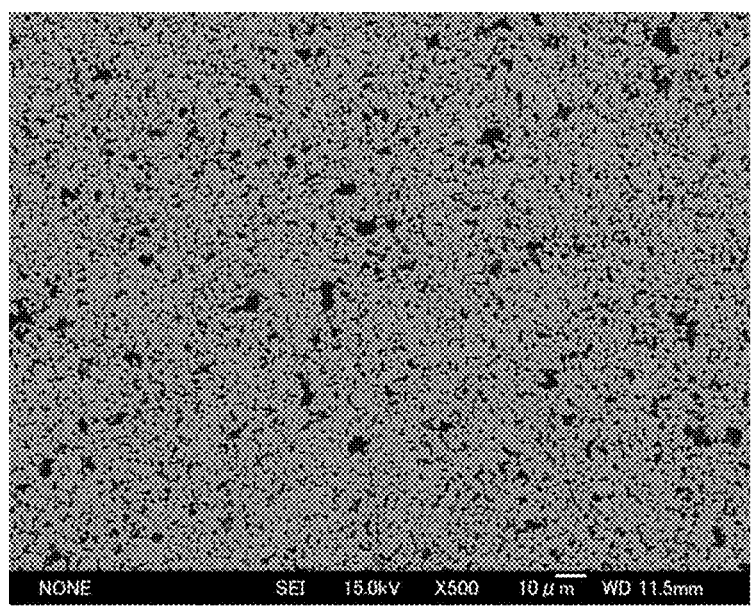
FIG. 3 is an SEM observed texture image showing a sputtering surface of a tungsten silicide target obtained in Example 1.

The sputtering surface of the resulting tungsten silicide target was observed for texture image with a scanning electron microscope (JSM-7000 F from JEOL). As a result, the SEM observed texture image as shown in FIG. 3 was obtained. Subsequently, for the SEM observed texture image, the area of each Si grain was defined by using image analysis software (NIS-Element D, from Nikon Corporation). The total area S1 of the Si grains was then calculated, and the total area I1 of the Si grains having an area per a Si grain of 63.6 μm² or more was calculated. Subsequently, the area ratio I1/S1(%) of I1 to S1 was calculated. Further, the average area per a Si grain in the SEM observed texture image was calculated.

(Area Ratio, Average Area and Grain Size of WSi₂ Grain)

Figure 4A:
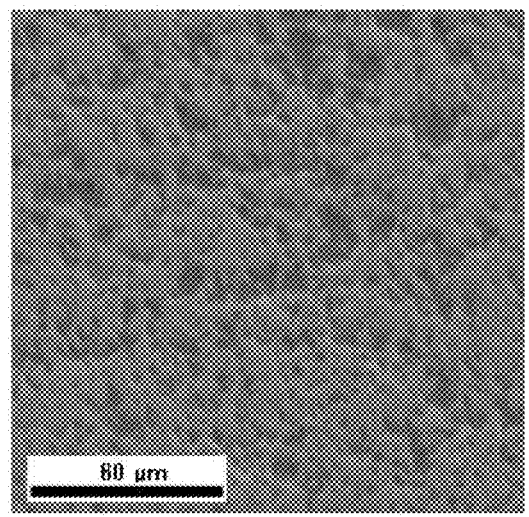
FIG. 4(A) is an SEM observed texture image showing a sputtering surface of a tungsten silicide target obtained in Example 1.
Figure 4B:
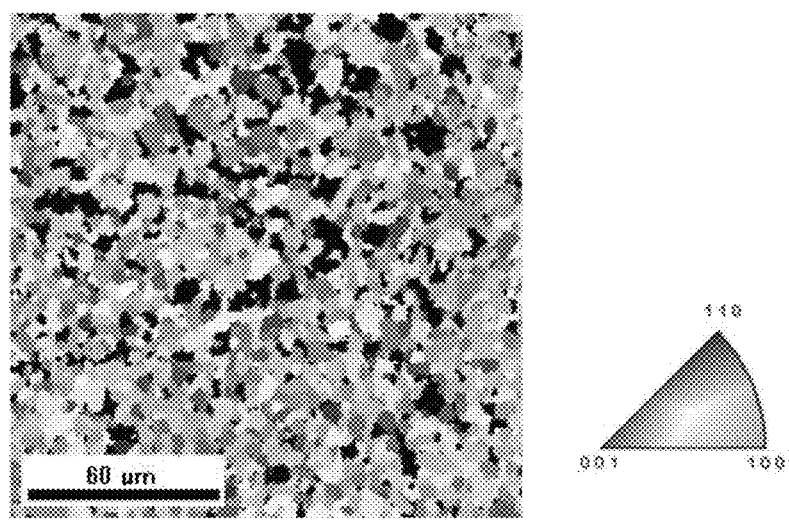
FIG. 4(B) is an EBSD observed texture image (WSi$_2$ phase) obtained by image analysis of FIG. 4(A)
Figure 4C:
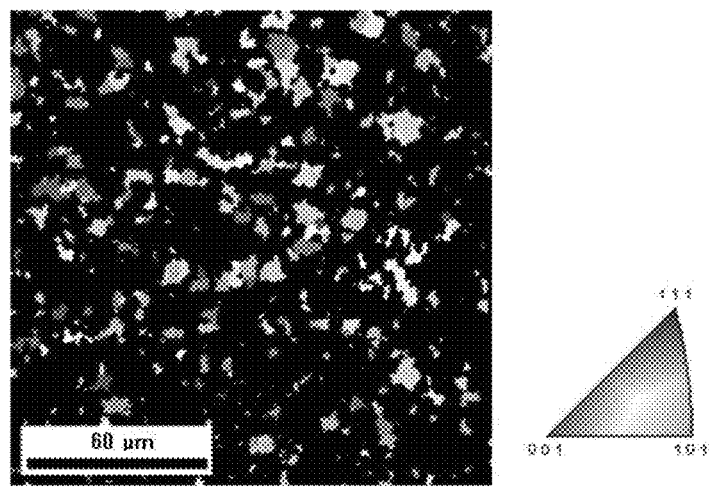
FIG. 4(C) is an EBSD observed texture image (Si phase) obtained by image analysis of FIG. 4(A).

The sputtering surface of the resulting tungsten silicide target was observed for texture image using EBSD. As a result, the SEM observed texture image as shown in FIG. 4(A) was obtained. Subsequently, for the SEM observed texture image, the EBSD observed texture images as shown in FIGS. 4(B) and 4(C) were obtained using EBSD analysis software. The area of each WSi₂ grain was defined in the EBSD observed texture image (see FIG. 4(B)). The total area S2 of the WSi₂ grains was then calculated, and the total area I2 of WSi₂ grains having an area per a WSi₂ grain of 63.6 μm² or more was calculated. The area ratio I2/S2(%) of I2 to S2 was then calculated. Further, the average area per a WSi₂ grain in the EBSD observed texture image (see FIG. 4(B)) was calculated. Further, the median diameters D50 of WSi₂ grains (see FIG. 4(B)) and the Si grains (see FIG. 4(C)) were calculated from the EBSD analysis software, respectively.

(Number of Particles)

Using the resulting tungsten silicide target, a tungsten silicide film was formed on a φ300 mm silicon wafer under the following sputtering conditions, and the number of particles having a size of 0.060 μm or more on the silicon wafer was measured using a particle counting device (SP 5 from KLA-Tencor) was measured. Then, the particles having a size of 0.060 μm or more mean that a diameter of the smallest circle that can surround a particle, virtually drawn on the silicon wafer, is 0.060 μm or more. The results are shown in Table 2.

<Sputtering Conditions>
Sputtering Device: Canon Anerva C 7100 GT;
Input: 300 W;
Substrate Temperature: 300° C.;
Degree of Vacuum Reached: 1×10⁻⁶ Torr;
Sputter Gas: Ar;
Gas Flow Rate: 40 sccm; and
Film Thickness: 50 nm.

Example 2

As shown in Table 1, a tungsten silicide target was obtained by the same method as that of Example 1, with the exception that for the hot pressing conditions, the pressing pressure was 16.2 MPa. Each characteristic evaluation and sputtering test were conducted for the resulting tungsten silicide target. The results are shown in Table 2.

Example 3

A tungsten silicide target was obtained by the same method as that of Example 1, with the exception that commercially available W powder (a BET value: 0.15 to 0.20 m²/g) and Si powder (a BET value: 1.8 to 2.0 m²/g) were prepared as raw material powders as shown in Table 1, and that for the hot pressing conditions, the pressing pressure was 16.2 MPa. Each characteristic evaluation and sputtering test were conducted for the resulting tungsten silicide target. The results are shown in Table 2.

Example 4

A tungsten silicide target was obtained by the same method as that of Example 1, with the exception that commercially available W powder (a BET value: 0.15 to 0.20 m²/g) and Si powder (a BET value: 1.8 to 2.0 m²/g) were prepared as raw material powders as shown in Table 1. Each characteristic evaluation and sputtering test were conducted for the resulting tungsten silicide target. The results are shown in Table 2.

Comparative Example 1

A tungsten silicide target was obtained by the same method as that of Example 1, with the exception that commercially available W powder (a BET value: 0.15 to 0.20 m²/g) and Si powder (a BET value: 1.8 to 2.0 m²/g) were prepared as raw material powders as shown in Table 1, and that for the hot pressing conditions, the pressing pressure was 16.2 MPa. Each characteristic evaluation and sputtering test were conducted for the resulting tungsten silicide target. The results are shown in Table 2.

Comparative Example 2

A tungsten silicide target was obtained by the same method as that of Comparative Example 1, with the exception that the mixed powder of the WSi₂ powder and the Si powder obtained by the silicide synthesis was further subjected to a deoxidation heat treatment as shown in Table 1. Each characteristic evaluation and sputtering test were conducted for the resulting tungsten silicide target. The results are shown in Table 2.

Comparative Example 3

A tungsten silicide target was obtained by the same method as that of Comparative Example 1, with the exception that the sintered body obtained by hot pressing was subjected to hot isostatic pressing (HIP; a temperature rising atmosphere: an argon atmosphere, a pressure: 150 MPa, a maintaining temperature: 1370° C., a retention time: 2 hours) to re-sinter it, as shown in Table 1. Each characteristic evaluation and sputtering test were conducted for the resulting tungsten silicide target. The results are shown in Table 2.

TABLE 1

|  | Raw Material Powder | | Pulverized Grain | | | |
|---|---|---|---|---|---|---|
|  | Si/W Atomic Ratio | W Powder BET Value [m²/g] | Si Powder BET Value [m²/g] | BET Value [m²/g] | Oxygen Concentration [ppm by mass] | Deoxidation Heat Treatment | Pressing Pressure [Mpa] |
| Example 1 | 2.7 | 0.75-0.85 | 1.8-2.0 | 0.7-0.8 | 1700-2500 | No | 29.4 |
| Example 2 | 2.7 | 0.75-0.85 | 1.8-2.0 | 0.7-0.8 | 1700-2500 | No | 16.2 |
| Example 3 | 2.7 | 0.15-0.20 | 1.8-2.0 | 0.6-0.7 | 1500-2300 | No | 16.2 |
| Example 4 | 2.7 | 0.15-0.20 | 1.8-2.0 | 0.5-0.6 | 700-1300 | No | 29.4 |
| Comparative Example 1 | 2.7 | 0.15-0.20 | 1.8-2.0 | 0.5-0.6 | 700-1300 | No | 16.2 |
| Comparative Example 2 | 2.7 | 0.15-0.20 | 1.8-2.0 | 0.6-0.7 | 200-300 | Yes | 16.2 |
| Comparative Example 3 | 2.7 | 0.15-0.20 | 1.8-2.0 | 0.2-0.3 | 1500-2300 | No | 16.2 |

TABLE 2

|  | Si Grain Median Diameter D50 [μm] | WSi₂ Grain Median Diameter D50 [μm] | Oxygen Concentration [ppm by mass] | Relative Density [%] | Flexural Strength | | Area Ratio (I1/S1) Having Area of Si grain of 63.6 μm² or more [%] | Average Area of Si Grains [μm²] | Area Ratio (I2/S2) Having Area of WSi² grain of 63.6 μm² or more [%] | Average Area of WSi₂ Grains [μm²] | Number of Particles |
|---|---|---|---|---|---|---|---|---|---|---|---|
|  |  |  |  |  | Average Value [MPa] | Weibull Modulus |  |  |  |  |  |
| Example 1 | 0.9 | 3.24 | 2100 | >99.9 | 395 | 6.6 | 0 | 1.5-1.9 | 0 | 5.03 | 20 |
| Example 2 | 0.9 | 3.3-3.7 | 2100 | >99.9 | 365 | 2.1 | 0 | 1.5-1.9 | 0 | 5.03 | 30 |
| Example 3 | 1.1 | 3.6-4.1 | 2000 | >99.9 | 350 | 2.3 | 5 | 3.0-3.2 | 0.14 | 5.31 | 300 |
| Example 4 | 1.1 | 4.2-4.8 | 700-1300 | >99.9 | 370 | 2.7 | 5 | 4.2-4.7 | 2.72 | 8.64 | 200 |
| Comparative Example 1 | 1.1 | 4.2-4.8 | 700-1300 | >99.9 | 340 | 2.0 | 5 | 4.3-4.7 | 2.72 | 8.64 | 350 |
| Comparative Example 2 | 1.6 | 4.1-4.7 | 220-290 | >99.9 | 300 | 1.9 | 15 | 5.4-6.0 | 3.86 | 9.32 | 1000 |
| Comparative Example 3 | 1.7 | 3.6-4.1 | 2100 | >99.9 | 330 | 3.1 | 8 | 5.3-5.9 | 3.52 | 9.37 | 1000 |

It was confirmed that the tungsten silicide target obtained in Examples 1 to 4 could efficiently decrease the particles during sputtering by controlling the composition of WSi$_x$, the area of the Si grains, and the Weibull Modulus of the flexural strength, respectively. Among others, for the WSi₂ grains on the sputtering surface of the tungsten silicide target obtained in Examples 1 to 2, substantially no WSi₂ grain having the area of 63.6 μm² or more was observed (0.1% or less), and the average area of the Si grains was also lower (less than 2.5 μm²). Therefore, it was confirmed that these tungsten silicide target could more efficiently decrease the number of particles.

DESCRIPTION OF REFERENCE NUMERALS

S101 refining step
S102 preparing step
S103 pulverizing step
S104 sintering step
S105 machining step

The invention claimed is:

1. A hot-pressed tungsten silicide target having a two-phase structure of a WSi₂ phase and a Si phase,
   wherein the tungsten silicide target is represented by a composition formula in an atomic ratio: WSi$_x$ with X>2.0;
   wherein, when observing a sputtering surface, a ratio (I1/S1) of a total area I1 of Si grains having an area per a Si grain of 63.6 μm² or more to a total area S1 of the Si grains forming the Si phase is 5% or less;
   wherein a ratio of a median diameter D50 of the Si grains forming the Si phase to a median diameter D50 of the WSi₂ grains forming the WSi₂ phase is 0.306 or less,
   wherein a Weibull modulus of flexural strength is 2.1 or more, and
   wherein the tungsten silicide target has an oxygen concentration of 5000 ppm by mass or less.

2. The tungsten silicide target according to claim 1, wherein, when observing the sputtering surface, a ratio (I2/S2) of a total area I2 of WSi₂ grains having an area per a WSi₂ grain of 63.6 μm² or more to a total area S2 of the WSi₂ grains forming the WSi₂ phase is 5% or less.

3. The tungsten silicide target according to claim 1, wherein, when observing the sputtering surface, a ratio (I2/S2) of a total area I2 of WSi₂ grains having an area per a WSi₂ grain of 63.6 μm² or more to a total area S2 of the WSi₂ grains forming the WSi₂ phase is 0.1% or less.

4. The tungsten silicide target according to claim 1, wherein, when observing the sputtering surface, an average area per a WSi₂ grain is 6.0 μm² or less.

5. The tungsten silicide target according to claim 4, wherein, when observing the sputtering surface, the average area per a WSi₂ grain is 3.0 μm² or less.

6. The tungsten silicide target according to claim 1, wherein, when observing the sputtering surface, an average area per a Si grain is less than 2.5 μm².

7. The tungsten silicide target according to claim 6, wherein the average area per a Si grain is 1.2 μm² or more.

8. The tungsten silicide target according to claim 1, wherein an average flexural strength is 250 MPa or more.

9. The tungsten silicide target according to claim 1, wherein the tungsten silicide target has the oxygen concentration of 700 ppm to 5000 ppm.

10. The tungsten silicide target according to claim 1, wherein the tungsten silicide target has a relative density of 99.9% or more.

11. A method for manufacturing the tungsten silicide target according to claim 1, the method comprising:
- a preparing step comprising mixing W powder with Si powder such that an atomic ratio Si/W is larger than 2.0, and causing a siliciding synthesis to prepare mixed powder in which $WSi_2$ phases and Si phases are combined to form individual grains;
- a pulverizing step of pulverizing the mixed powder; and
- a sintering step of subjecting the pulverized mixed powder to hot-pressing sintering to provide a sintered body.

12. The method according to claim 11, wherein the W powder has a BET value of 1.0 m²/g or less.

13. The method according to claim 11, wherein the Si powder has a BET value of 2.5 m²/g or less.

14. The method according to claim 11, wherein the pulverizing step comprises pulverizing the mixed powder such that a BET value of pulverized grains is 1.0 m²/g or less.

15. A method for manufacturing a tungsten silicide film, the method comprising a deposition step of carrying out sputtering using the tungsten silicide target according to claim 1.

* * * * *